(12) United States Patent
Cosand (10) Patent No.: US 8,207,782 B1
(45) Date of Patent: Jun. 26, 2012

(54) CIRCUITS AND METHODS TO MINIMIZE THERMALLY GENERATED OFFSET VOLTAGES

(75) Inventor: Albert E. Cosand, Agoura Hills, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 13/038,202

(22) Filed: Mar. 1, 2011

Related U.S. Application Data (62) Division of application No. 12/272,533, filed on Nov. 17, 2008, now Pat. No. 7,948,297.

(51) Int. Cl.
*H01L 35/00* (2006.01)
(52) U.S. Cl. .............. 327/513; 327/62; 327/63; 327/64; 327/65; 339/256
(58) Field of Classification Search .................. 327/513, 327/350, 359, 62–65; 339/256
See application file for complete search history.

(56) References Cited

U.S. PATENT DOCUMENTS

| 4,724,337 A | 2/1988 | Maeda et al. ................. 327/538 |
| 5,610,547 A * | 3/1997 | Koyama et al. ............... 327/350 |
| 7,012,343 B2 | 3/2006 | Inn et al. ......................... 307/31 |

\* cited by examiner

*Primary Examiner* — Lincoln Donovan
*Assistant Examiner* — Shikha Goyal
(74) *Attorney, Agent, or Firm* — Ladas & Parry (57) ABSTRACT

A circuit to minimize thermally generated offset voltages includes a differential pair of transistors having a first transistor and a second transistor and coupled to a current source, a differential input having a first input coupled to the first transistor and having a second input coupled to the second transistor, a pair of bypass transistors having a first bypass transistor and a second bypass transistor, the first bypass transistor coupled in parallel with the first transistor and the second bypass transistor coupled in parallel with the second transistor, wherein the pair of bypass transistors is coupled to the current source, and control circuitry coupled to the pair of bypass transistors for controlling current through the pair of bypass transistors.

11 Claims, 6 Drawing Sheets

```
┌─────────────────────────────────────────────────────┐
│ PROVIDING A BYPASS CIRCUIT IN PARALLEL WITH THE  120│
│ DIFFERENTIAL PAIR OF TRANSISTORS, THE BYPASS        │
│ CIRCUIT COUPLED TO THE CURRENT SOURCE               │
└─────────────────────────────────────────────────────┘
                          │
┌─────────────────────────────────────────────────────┐
│                                                  122│
│ PREVENTING THE BYPASS CIRCUIT FROM CONDUCTING       │
│ CURRENT WHEN A DIFFERENCE BETWEEN THE FIRST INPUT   │
│ AND THE SECOND INPUT IS SMALL                       │
│                                                     │
└─────────────────────────────────────────────────────┘
                          │
┌─────────────────────────────────────────────────────┐
│                                                  124│
│ CONTROLLING THE BYPASS CIRCUIT TO CONDUCT           │
│ CURRENT WHEN THE DIFFERENCE BETWEEN THE FIRST       │
│ INPUT AND THE SECOND INPUT IS RELATIVELY LARGE      │
└─────────────────────────────────────────────────────┘
```

FIG. 5

130 — PROVIDING A PAIR OF BYPASS TRANSISTORS HAVING A FIRST BYPASS TRANSISTOR COUPLED TO THE FIRST INPUT AND A SECOND BYPASS TRANSISTOR COUPLED TO THE SECOND INPUT AND HAVING A THIRD BYPASS TRANSISTOR COUPLED BETWEEN THE PAIR OF BYPASS TRANSISTORS AND THE CURRENT SOURCE

132 — CONTROLLING THE THIRD BYPASS TRANSISTOR TO PREVENT THE PAIR OF BYPASS TRANSISTORS FROM CONDUCTING CURRENT WHEN A DIFFERENCE BETWEEN THE FIRST INPUT AND THE SECOND INPUT IS SMALL

134 — CONTROLLING THE THIRD BYPASS TRANSISTOR SO THAT AT LEAST ONE OF THE BYPASS TRANSISTORS CONDUCTS CURRENT WHEN THE DIFFERENCE BETWEEN THE FIRST INPUT AND THE SECOND INPUT IS RELATIVELY LARGE

136 — CONTROLLING THE THIRD TRANSISTOR TO PREVENT THE DIFFERENTIAL PAIR OF TRANSISTORS FROM CONDUCTING CURRENT WHEN A DIFFERENCE BETWEEN THE FIRST INPUT AND THE SECOND INPUT IS RELATIVELY LARGE

FIG. 6

CIRCUITS AND METHODS TO MINIMIZE THERMALLY GENERATED OFFSET VOLTAGES

This is a divisional application of U.S. patent application Ser. No. 12/272,533, filed on Nov. 17, 2008, which is incorporated herein as though set forth in full.

STATEMENT REGARDING FEDERALLY SPONSORED RESEARCH OR DEVELOPMENT

The present invention was made with support from the United States Government under contract H98230-05-C-0472. The United States Government has certain rights in the invention.

FIELD

This disclosure relates to circuits with differential pairs of transistors, and in particular to circuits and methods to minimize the thermally generated offset voltages therein.

BACKGROUND

Autozeroing techniques are used in the prior art to control offsets in MOS circuits. In these techniques the offset in a MOS circuit is sampled and then used to zero out the offset. These techniques become more difficult as circuit speeds increase especially if adequate noise performance is to be attained. For bipolar circuits there are trimming or calibration techniques, but these are of limited usefulness for thermally induced errors that can change fairly rapidly.

What are needed are circuits and methods to limit the errors caused by thermally induced offsets or threshold shifts in comparators or folding amplifiers. In particular these circuits and methods are needed for flash analog to digital converters (ADCs) or folding ADCs in which a bank of comparators or folding amplifiers have their thresholds distributed across the entire input range. Those circuits at the top or bottom of the input range have their inputs driven below or above their thresholds a majority of the time, producing asymmetric power dissipation in their input stages, which causes thermally generated offset voltages in the circuits, reducing their accuracy and performance. This is particularly a problem for very high speed ADCs where high power densities are required to obtain the desired speed. The embodiments of the present disclosure answer these and other needs.

SUMMARY

In a first embodiment disclosed herein, a circuit to minimize thermally generated offset voltages includes a differential pair of transistors having a first transistor and a second transistor and coupled to a current source, a differential input having a first input coupled to the first transistor and having a second input coupled to the second transistor, a pair of bypass transistors having a first bypass transistor and a second bypass transistor, the first bypass transistor coupled in parallel with the first transistor and the second bypass transistor coupled in parallel with the second transistor, wherein the pair of bypass transistors is coupled to the current source, and control circuitry coupled to the pair of bypass transistors for controlling current through the pair of bypass transistors, the control circuit configured to control the pair of bypass transistors to prevent the pair of bypass transistors from conducting current when a difference between the first input and the second input is small and configured to control the pair of bypass transistors so that at least one of the bypass transistors conducts current when the difference between the first input and the second input is relatively large.

In another embodiment disclosed herein, a circuit to minimize thermally generated offset voltages includes a differential pair of transistors having a first transistor and a second transistor, a third transistor coupled between the differential pair of transistors and a current source, a pair of bypass transistors having a first bypass transistor and a second bypass transistor, a third bypass transistor coupled between the pair of bypass transistors and the current source, a differential input having a first input coupled to the first transistor and the first bypass transistor and having a second input coupled to the second transistor and the second bypass transistor, and control circuitry coupled to the third transistor and the third bypass transistor for controlling current through the pair of bypass transistors, the control circuit configured to control the third bypass transistor to prevent the pair of bypass transistors from conducting current when a difference between the first input and the second input is small and configured to control the third bypass transistor so that at least one of the bypass transistors conducts current when the difference between the first input and the second input is relatively large.

In yet another embodiment disclosed herein, a method of minimizing thermally generated offset voltages in a circuit having a differential pair of transistors having a first transistor and a second transistor coupled to a current source and a differential input having a first input coupled to the first transistor and having a second input coupled to the second transistor comprises providing a bypass circuit in parallel with the differential pair of transistors, the bypass circuit coupled to the current source, and controlling a current through the bypass circuit to prevent the bypass circuit from conducting current when a difference between the first input and the second input is small and controlling the current through the bypass circuit to conduct current when the difference between the first input and the second input is relatively large.

In yet another embodiment disclosed herein, a method of minimizing thermally generated offset voltages in a circuit having a differential pair of transistors having a first transistor and a second transistor and having a third transistor coupled between the differential pair of transistors and a current source, and having a differential input having a first input coupled to the first transistor and having a second input coupled to the second transistor comprises providing a pair of bypass transistors having a first bypass transistor coupled to the first input and a second bypass transistor coupled to the second input and having a third bypass transistor coupled between the pair of bypass transistors and the current source, and controlling the third transistor and the third bypass transistor to prevent the pair of bypass transistors from conducting current when a difference between the first input and the second input is small and controlling the third transistor and the third bypass transistor so that at least one of the bypass transistors conducts current when the difference between the first input and the second input is relatively large.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In the following for the sake of simplicity, the description of the circuitry has been presented in terms of npn bipolar transistors; however, the present disclosure is also applicable to circuits implemented with bipolar or field-effect transistors of either polarity.

Figure 1:
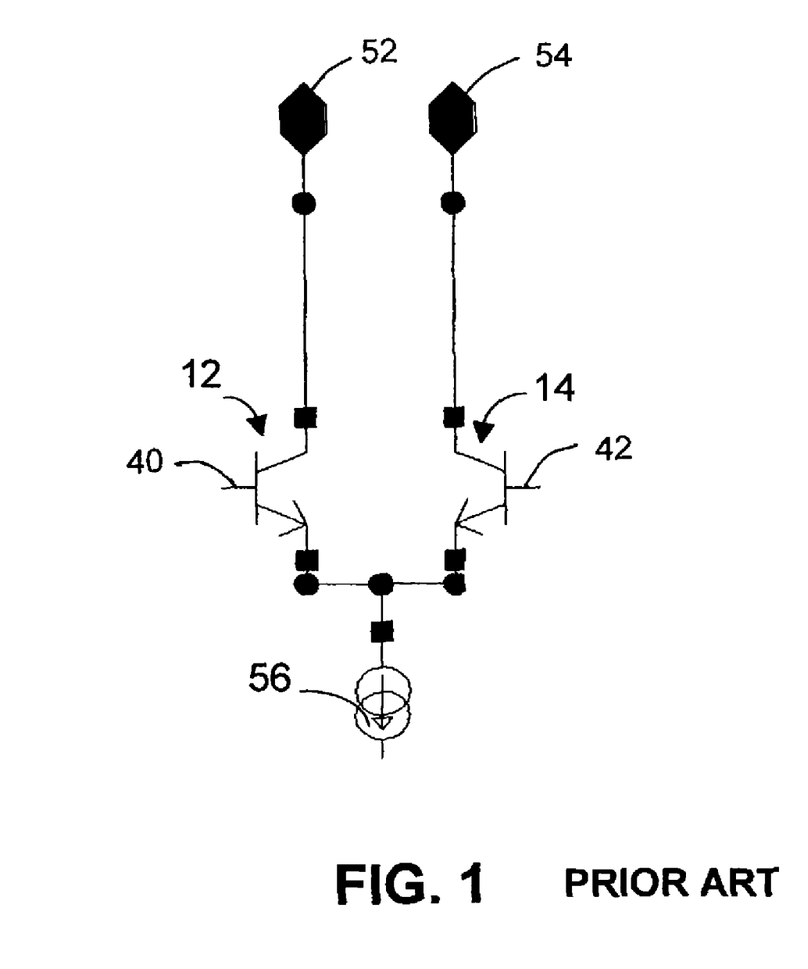
FIG. 1 is a circuit diagram in accordance with the prior art.

A differential circuit in the prior art is shown in FIG. 1 and consists of a differential pair of transistors 12, 14 and a current source 56. Typical applications include amplifiers and comparators.

Figure 2:
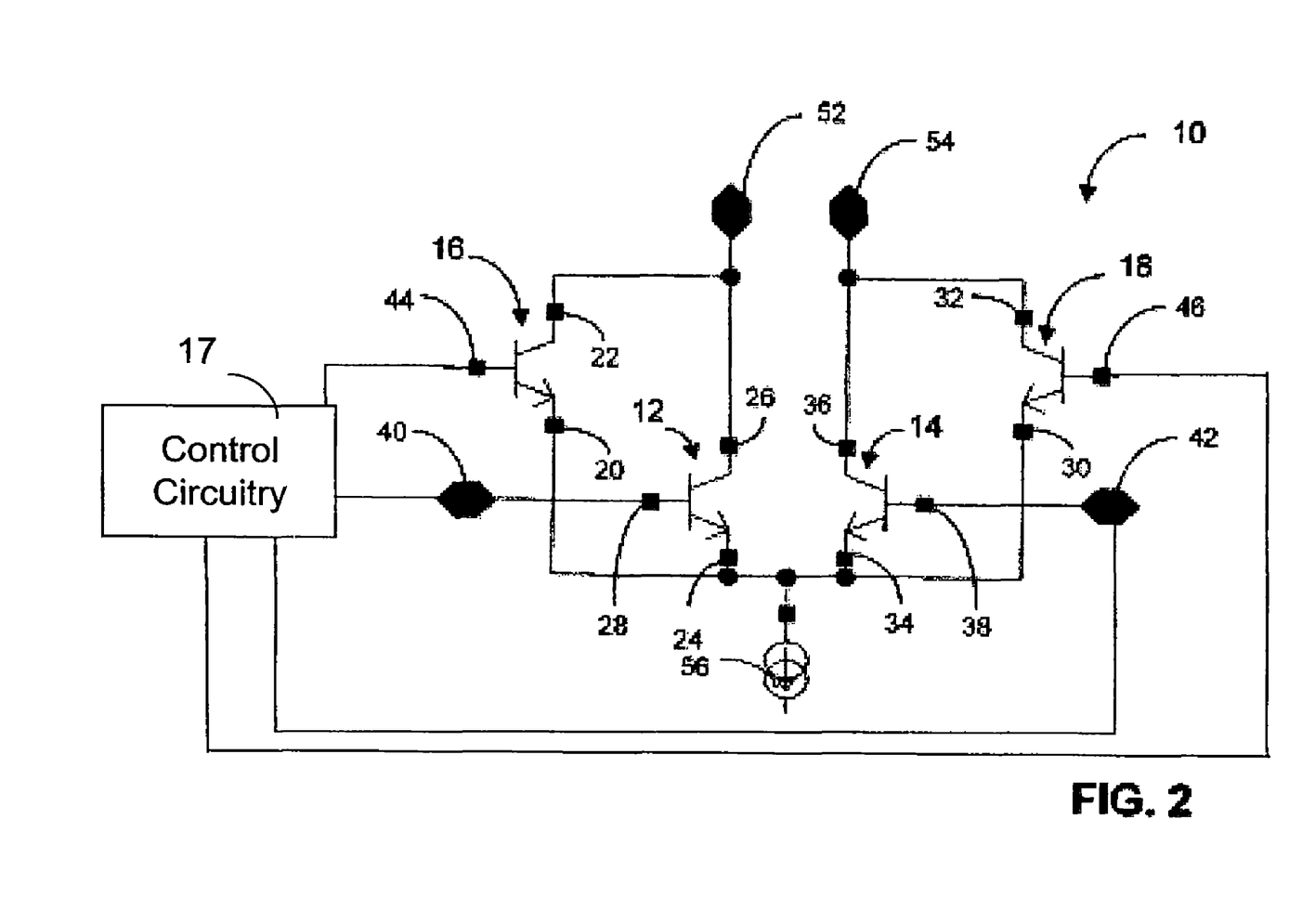
FIG. 2 is a circuit diagram for minimizing thermally generated offset voltages in accordance with the present disclosure.

Referring now to FIG. 2, a circuit diagram 10 for minimizing thermally generated offset voltages in differential circuits in accordance with the present disclosure is shown. In the present disclosure an additional pair of bypass transistors 16, 18 are connected in parallel with the differential pair of transistors 12, 14, respectively. Control circuitry (not shown) controls the additional pair of bypass transistors 16, 18. One transistor 16 of the additional pair of bypass transistors has its emitter terminal 20 and collector terminal 22 connected to the emitter terminal 24 and collector terminal 26, respectively, of transistor 12 of the differential pair. Collector 26 is also connected to differential output 52. Another transistor 18 of the additional pair of bypass transistors has its emitter terminal 30 and collector terminal 32 connected to the emitter terminal 34 and collector terminal 36, respectively, of transistor 14 of the differential pair. Collector 36 is also connected to differential output 54.

The additional pair of bypass transistors 16, 18 provides an alternative current path to bypass the current that would normally flow in the differential pair of transistors 12, 14. This has the effect of limiting asymmetric self heating in transistors 12, 14 that may produce thermally generated offset voltages. It is desirable to minimize thermally generated offset voltages because these may likely result in a significant error in determining the sign and/or magnitude of the input voltage difference between the differential inputs, which are input 40 to base 28 and input 42 to the base 38 of the differential pair of transistors 12 and 14, respectively. The error may be especially significant when the input voltage difference between the differential inputs 40, 42 is small. When the input voltage difference between the differential inputs 40, 42 to the bases of the input differential pair 12, 14 is large, then thermally generated offset voltages do not represent a significant error; however, asymmetric self heating of transistor 12 and transistor 14 may occur when the difference between the differential inputs 40, 42 is large. The asymmetric self heating produces thermally generated offset voltages, which are likely to result in significant errors when the difference between the differential inputs 40, 42 is small.

The control circuitry according to the present disclosure operates such that when the input voltage difference to the bases 28, 38 of the input differential pair 12, 14, respectively, is small, the differential pair 12, 14 operates normally and the additional pair of bypass transistors 16, 18 are controlled by the control circuitry to have their bases 44 and 46, respectively, maintained at a more negative voltage than the bases 28, 38 of the differential pair of transistors 12, 14, so that the additional pair of bypass transistors 16, 18 conduct essentially no current. If pnp bipolar transistors or field effect transistors are used rather than npn bipolar transistors then the control circuitry still operates to turn off the bypass transistors so that they conduct essentially no current.

When the input voltage difference to the bases 28, 38 of the input differential pair 12, 14, respectively, is relatively large, the control circuitry controls the additional pair of bypass transistors 16, 18 so that the base (44 or 46) of one of the bypass transistors 16, 18 is pulled high, so that one of the bypass transistors (16 or 18) conducts current from the differential output (52 or 54), respectively, to the current source 56, rather than transistor (12 or 14) conducting the current from the differential output (52 or 54), respectively, to the current source 56.

Because the bypass pair of transistors conduct the current, asymmetric self heating in the differential pair of transistors 12, 14 is eliminated or substantially decreased, thus reducing or eliminating thermally generated offset voltages.

Further, because the control circuitry that controls the bypass transistors 16, 18 only controls them to bypass current when the input voltage difference is relatively large, offset errors in the control circuitry, or in the bypass transistors 16, 18 themselves, is of little significance. If bipolar pnp transistors or field effect transistors are used rather than npn bipolar transistors then the control circuitry still operates to turn on one of the bypass transistors 16, 18, so that it conducts current to the current source 56 instead of the differential pair of transistors 12, 14 conducting the current.

The control circuitry may derive the voltages to drive the bases 44, 46 of the additional pair of transistors 16, 18 directly from the differential inputs 40, 42. If the differential inputs 40, 42 have a small difference then the control circuitry controls the voltages to turn the additional pair of transistors 16, 18 off so that they conduct essentially no current. If the differential inputs 40, 42 have a large difference then the control circuitry controls the voltages to turn one of the transistors of the additional pair of transistors 16, 18 on to conduct current. The transistor 16 or 18 that is turned on corresponds to the transistor 12 or 14, respectively, of the differential pair of transistors 12, 14 that is conducting the most current. This may be readily determined by the control circuitry by observing the differential inputs 40, 42.

In an ADC where comparators or folding amplifiers are driven from a ladder structure, the control voltages may be derived from higher and lower taps on the ladder.

Figure 3:
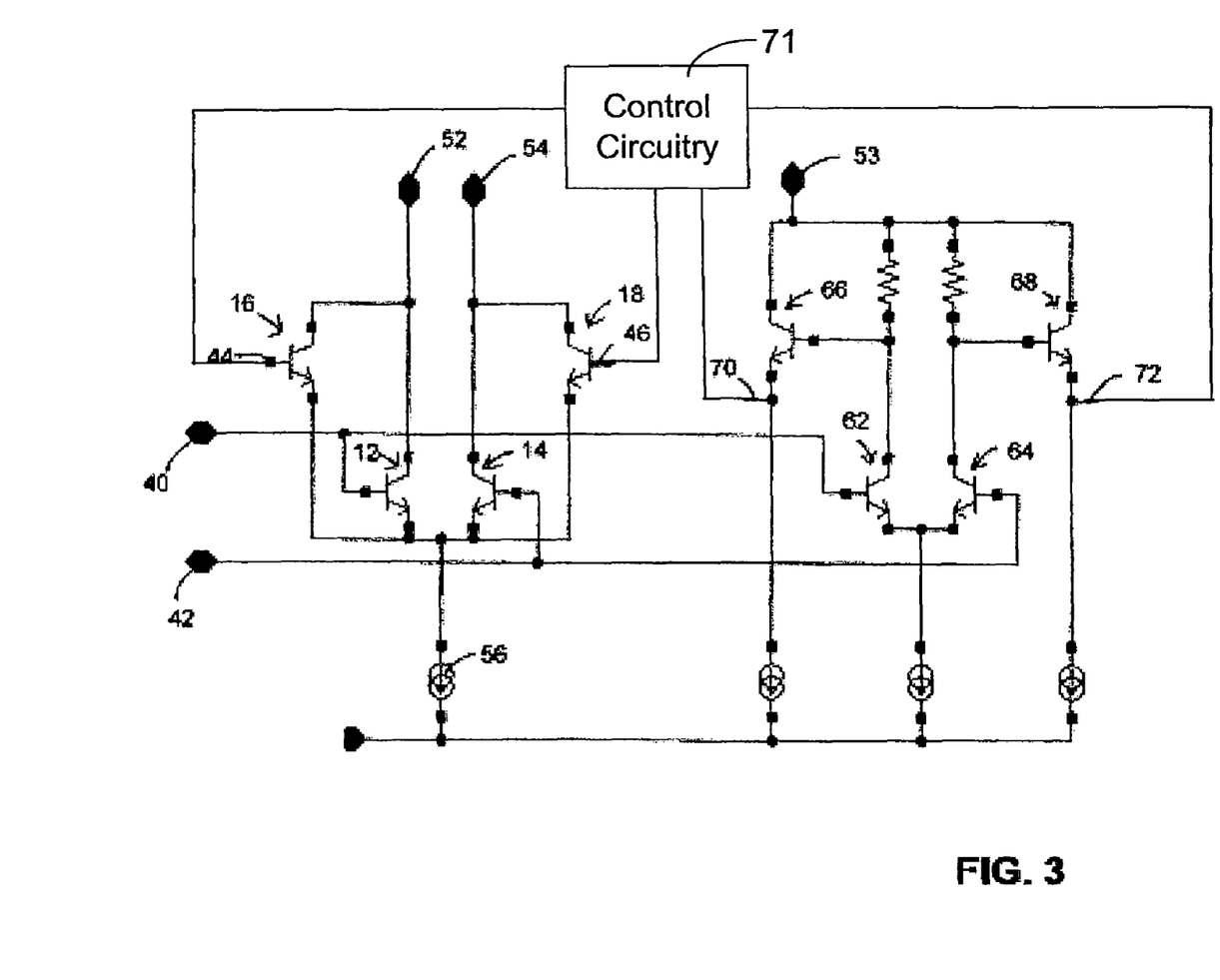
FIG. 3 is another circuit diagram for minimizing thermally generated offset voltages in accordance with the present disclosure.

An example of such a circuit approach in accordance with the present disclosure is shown in FIG. 3. The circuit with transistors 12, 14, 16, and 18 is the same as in FIG. 2. The circuit with the transistors 62, 64, 66, and 68 generates the control voltages to the additional pair of bypass transistors higher or lower on the ladder. For example, in one embodiment control voltages from emitters 70 and 72 may be used to control the bases 44 and 46, respectively on transistors 16 and 18.

In circuits with folding amplifiers where the transconductance of differential pair 12, 14 may need to be well behaved over a range corresponding to several threshold spacings, the ladder positions used to drive the bases of the additional pair of bypass transistors may be more than one step away.

The possibility of modifications and variations of the control circuitry will be apparent to practitioners skilled in the art. There are many possible implementations of control circuitry to control the additional pair of bypass transistors via their bases in embodiments with bipolar transistors or their gates in embodiments with field effect transistors. Also it will be obvious to an ordinary person skilled in the art that when field effect transistors are used then drains, gates, and sources would be substituted in the above description for the collectors, bases and emitters of bipolar transistors.

Figure 4:
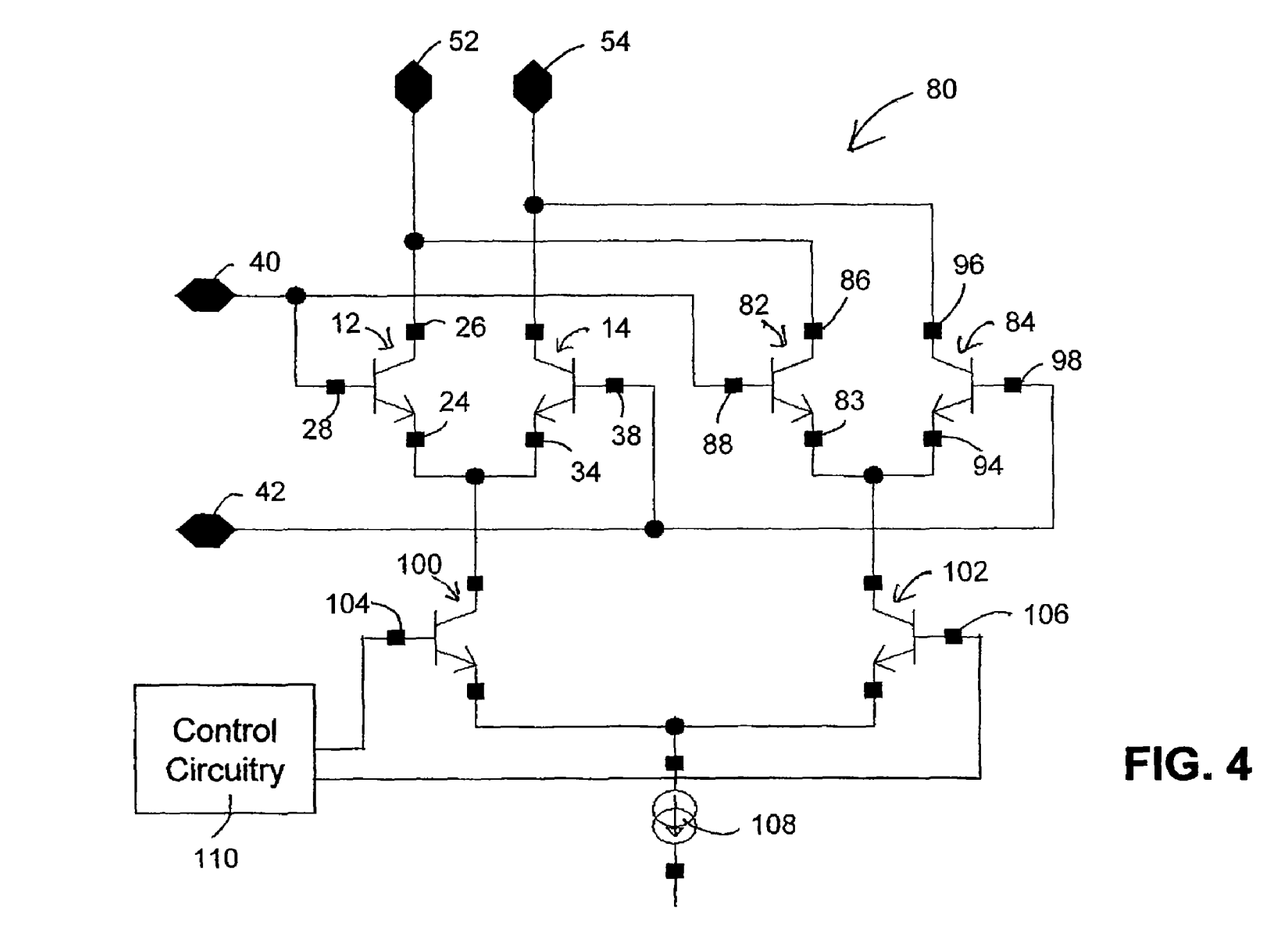
FIG. 4 is yet another circuit diagram for minimizing thermally generated offset voltages in accordance with the present disclosure.

FIG. 4 shows a circuit diagram 80 for another embodiment in accordance with the present disclosure to protect a differential pair from asymmetric self-heating to minimize thermally generated offset voltages. In this embodiment the differential pair 12, 14 and the additional pair of bypass transistors 82, 84 have their base and collector terminals paralleled and have emitter terminals of the two differential pairs brought out separately. Additional circuitry is provided to steer current to the emitters 24, 34 of the differential pair 12, 14 when the difference in the differential input voltage is small, and to steer the current to the emitters 83, 94 of the additional pair of bypass transistors 82, 84 when the difference in the differential input voltage is relatively large, so that if asymmetric self heating is to occur it will be primarily confined to the additional pair of bypass transistors for which accuracy is of less concern.

The base 88 of transistor 82 is connected to base 28 of transistor 12, and the base 98 of transistor 84 is connected to base 38 of transistor 14. The differential inputs 40 and 42 are connected to bases 28 and 88, and to bases 38 and 98, respectively. The collector 86 of transistor 82 is connected to collector 26 of transistor 12, and the collector 96 of transistor 84 is connected to collector 36 of transistor 14.

Control circuitry 110 controls transistors 100 and 102 via bases 104 and 106, respectively, so that current is conducted from the differential outputs 52, 54 to current source 108 through the differential pair of transistors 12, 14 when the difference between the differential inputs 40 and 42 is small. When the difference between the differential inputs 40 and 42 is large, the control circuitry 110 controls transistors 100 and 102 via bases 104 and 106, respectively, so that current is conducted from the differential outputs 52 and 54 to current source 108 through the additional pair of transistors 82, 84. Because base 88 is connected to base 28, and because base 98 is connected to base 38, the additional pair of bypass transistors 82 and 84 effectively operate the same as the differential pair of transistors 12, 14 would have operated, when the difference between the differential inputs 40 and 42 is large; however, thermally generated offset voltages in the transistors 12, 14 of the differential pair are avoided. Because the control circuitry 110 that controls the transistors 100 and 102 to steer current only controls them to bypass current to the additional pair of bypass transistors 82, 84 when the difference between the differential inputs 40 and 42 is large, offset errors in the control circuitry, or in the bypass transistors 82, 84 themselves, is of little significance.

The embodiment of FIG. 4 requires more voltage headroom to operate, but has the advantage that, if the control circuitry to steer the current is somewhat slow, the output current will still be approximately correct, with the error dependent on the offset of the additional pair of bypass transistors 82, 84 and the fraction of the current that is still flowing through bypass transistors 82, 84.

The embodiment of FIG. 4 is shown with bipolar transistors; however, field effect transistors can be substituted for the bipolar transistors in the present disclosure. It is also evident to one skilled in the art that there are many possible implementations of control circuitry to control the current steering between the differential pair 12, 14 and the additional pair of bypass transistors 82, 84 via the bases 104 and 106 in embodiments with bipolar transistors 100 and 102, respectively or via gates in embodiments with field effect transistors. Also it will be obvious to an ordinary person skilled in the art that when field effect transistors are used then drains, gates, and sources would be substituted in the above description for the collectors, bases and emitters of bipolar transistors.

Figure 5:
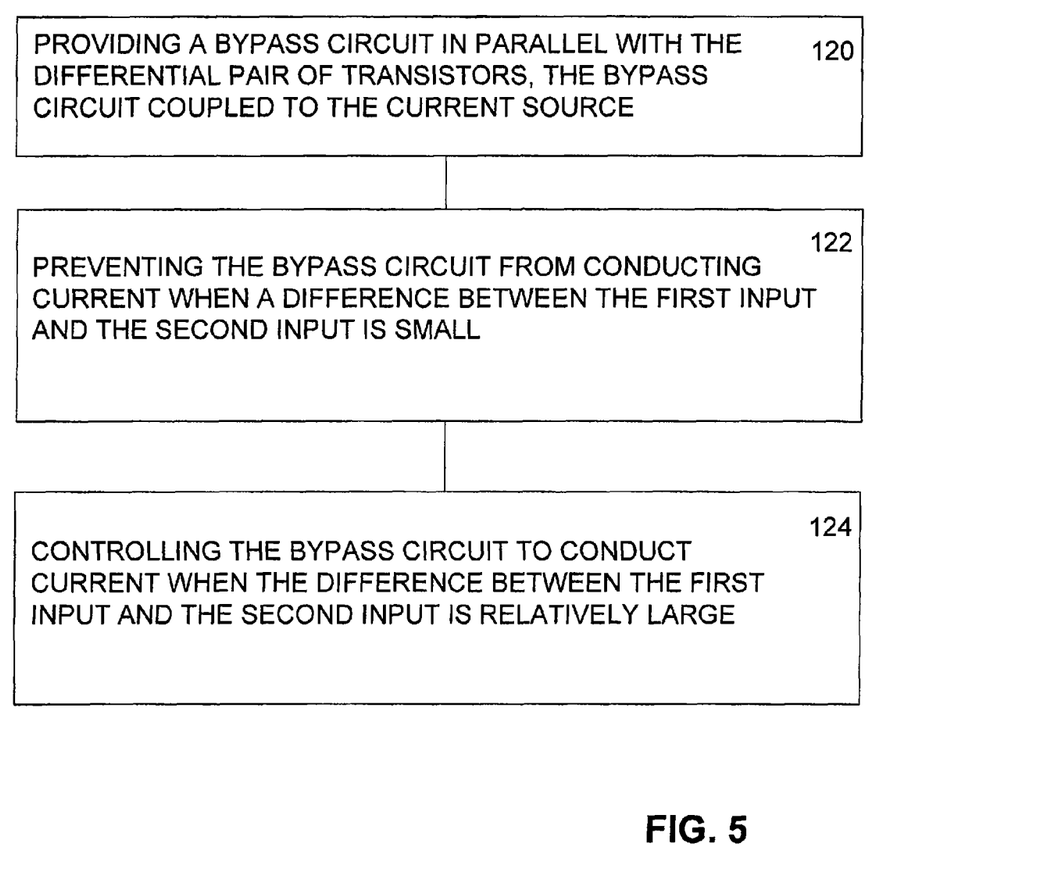
FIG. 5 is a flow diagram of a method for minimizing thermally generated offset voltages in accordance with the present disclosure.

FIG. 5 is a flow diagram of a method for minimizing thermally generated offset voltages in accordance with the present disclosure. The method of minimizing thermally generated offset voltages in a circuit having a differential pair of transistors 12, 14 having a first transistor 12 and a second transistor 14 coupled to a current source 56 and a differential input having a first input 40 coupled to the first transistor 12 and having a second input 42 coupled to the second transistor 14 begins in step 120 by providing a bypass circuit, for example transistors 16, 18 in parallel with the differential pair of transistors, wherein the bypass circuit is coupled to the current source. Then in step 122 the bypass circuit is prevented from conducting current when a difference between the first input 40 and the second input 42 is small. In step 124 the bypass circuit is controlled to conduct current when the difference between the first input 40 and the second input 42 is relatively large.

Figure 6:
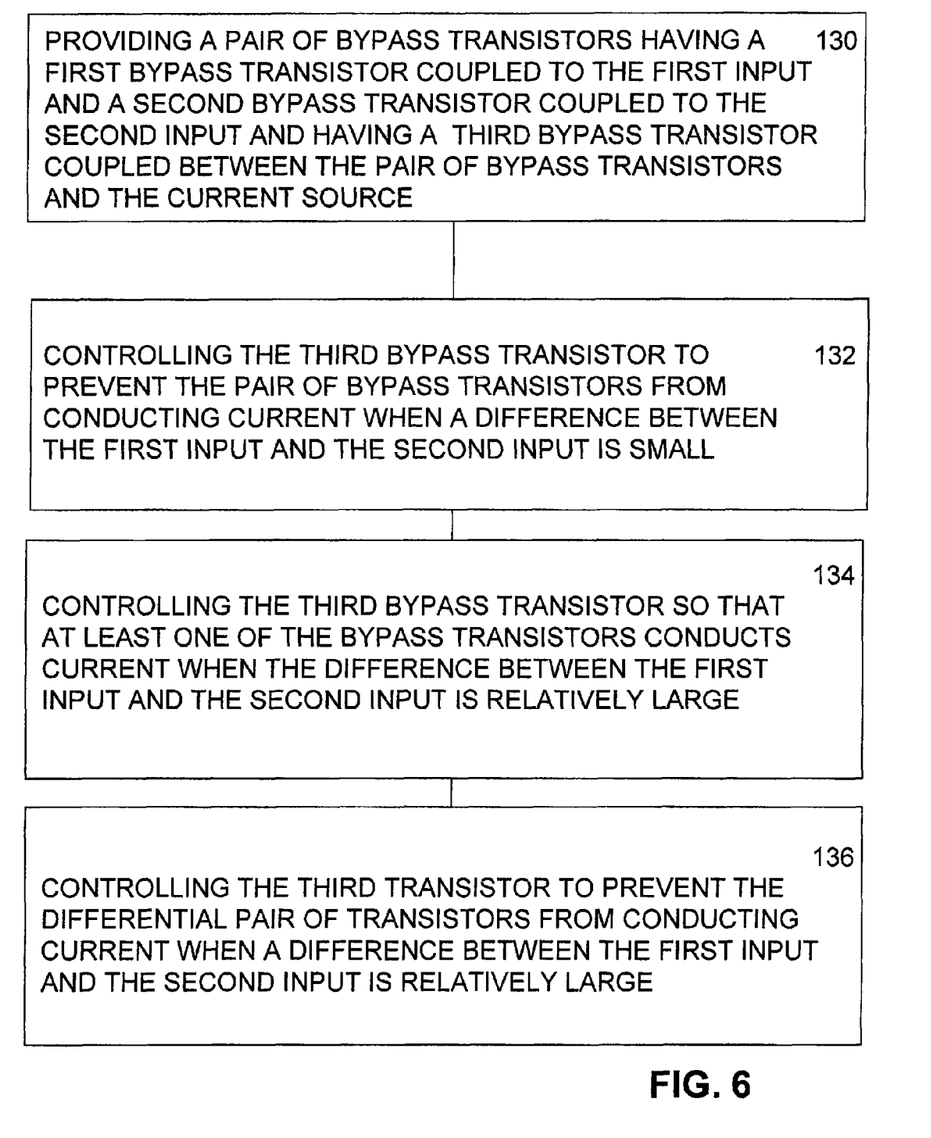
FIG. 6 is a flow diagram of another method for minimizing thermally generated offset voltages in accordance with the present disclosure.

FIG. 6 is a flow diagram of another method for minimizing thermally generated offset voltages in accordance with the present disclosure. The method of minimizing thermally generated offset voltages in a circuit having a differential pair of transistors 12, 14 having a first transistor 12 and a second transistor 14 and having a third transistor 100 coupled between the differential pair of transistors 12, 14 and a current source 108, and having a differential input having a first input 40 coupled to the first transistor 12 and having a second input 42 coupled to the second transistor 14 begins in step 130 by providing a pair of bypass transistors 82 and 84 having a first bypass transistor 82 coupled to the first input 40 and a second bypass transistor 84 coupled to the second input 42 and having a third bypass transistor 102 coupled between the pair of bypass transistors 82 and 84 and the current source 108. In step 132 the third bypass transistor 102 is controlled to prevent the pair of bypass transistors 82, 84 from conducting current when a difference between the first input 40 and the second input 42 is small. In step 134 the third bypass transistor 102 is controlled so that at least one of the bypass transistors 82, 84 conducts current when the difference between the first input 40 and the second input 42 is relatively large. Then in step 136 the third transistor 100 is controlled to prevent the differential pair of transistors 12, 14 from conducting current when a difference between the first input 40 and the second input 42 is relatively large.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A circuit to minimize thermally generated offset voltages comprising:
    a differential pair of transistors having a first transistor and a second transistor;
    a third transistor coupled between the differential pair of transistors and a current source;
    a pair of bypass transistors having a first bypass transistor and a second bypass transistor;
    a third bypass transistor coupled between the pair of bypass transistors and the current source;
    a differential input having a first input coupled to the first transistor and the first bypass transistor and having a second input coupled to the second transistor and the second bypass transistor; and
    control circuitry coupled to the third transistor and the third bypass transistor for controlling current through the pair of bypass transistors, the control circuit configured to control the third bypass transistor to prevent the pair of bypass transistors from conducting current when a difference between the first input and the second input is small and configured to control the third bypass transistor so that at least one of the bypass transistors conducts current when the difference between the first input and the second input is relatively large.

2. The circuit of claim 1 wherein the control circuitry for controlling current through the pair of bypass transistors is coupled to the first and second input of the differential input.

3. The circuit of claim 2 wherein the control circuit is configured to control the third transistor to prevent or substantially reduce the current conducted by the differential pair of transistors when a difference between the first input and the second input is relatively large.

4. The circuit of claim 1 wherein the first transistor, second transistor, third transistor, first bypass transistor, second bypass transistor, and third bypass transistor comprise bipolar transistors.

5. The circuit of claim 4 wherein:
    a collector of the first transistor is coupled to a collector of the first bypass transistor;
    an emitter of the first transistor is coupled to an emitter of the second transistor and to a collector of the third transistor;
    a base of the first transistor is coupled to a base of the first bypass transistor;
    a collector of the second transistor is coupled to a collector of the second bypass transistor;
    an emitter of the first bypass transistor is coupled to an emitter of the second bypass transistor and to a collector of the third bypass transistor; and
    a base of the second transistor is coupled to a base of the second bypass transistor.

6. The circuit of claim 1 wherein the first transistor, second transistor, third transistor, first bypass transistor, second bypass transistor, and third bypass transistor comprise field effect transistors.

7. The circuit of claim 6 wherein:
    a drain of the first transistor is coupled to a drain of the first bypass transistor;
    a source of the first transistor is coupled to a source of the second transistor and to a drain of the third transistor;
    a gate of the first transistor is coupled to a gate of the first bypass transistor;
    a drain of the second transistor is coupled to a drain of the second bypass transistor;
    a source of the first bypass transistor is coupled to a source of the second bypass transistor and to a drain of the third bypass transistor; and
    a gate of the second transistor is coupled to a gate of the second bypass transistor.

8. A method of minimizing thermally generated offset voltages in a circuit having a differential pair of transistors having a first transistor and a second transistor and having a third transistor coupled between the differential pair of transistors and a current source, and having a differential input having a first input coupled to the first transistor and having a second input coupled to the second transistor, the method comprising:
    providing a pair of bypass transistors having a first bypass transistor coupled to the first input and a second bypass transistor coupled to the second input and having a third bypass transistor coupled between the pair of bypass transistors and the current source; and
    controlling the third transistor and the third bypass transistor to prevent the pair of bypass transistors from conducting current when a difference between the first input and the second input is small and controlling the third transistor and the third bypass transistor so that at least one of the bypass transistors conducts current when the difference between the first input and the second input is relatively large.

9. The circuit of claim 8 wherein controlling the third transistor and the third bypass transistor further comprises:
    controlling the third transistor to prevent or substantially reduce the current conducted by the differential pair of transistors when a difference between the first input and the second input is relatively large.

10. The method of claim 8 wherein the first transistor, second transistor, third transistor, first bypass transistor, second bypass transistor, and third bypass transistor comprise bipolar transistors.

11. The method of claim 8 wherein the first transistor, second transistor, third transistor, first bypass transistor, second bypass transistor, and third bypass transistor comprise field effect transistors.

* * * * *